(12) United States Patent
Hamilton et al.

(10) Patent No.: US 8,288,074 B2
(45) Date of Patent: Oct. 16, 2012

(54) PHOTOIMAGING METHOD AND APPARATUS

(75) Inventors: Sheila Hamilton, Kilmacolm (GB); Charles Jonathan Kennett, Bridge of Weir (GB)

(73) Assignee: Rainbow Technology Systems Limited, Renfrew (GB)

( * ) Notice: Subject to any disclaimer, the term of this patent is extended or adjusted under 35 U.S.C. 154(b) by 511 days.

(21) Appl. No.: 12/499,671

(22) Filed: Jul. 8, 2009

(65) Prior Publication Data

US 2010/0012352 A1 Jan. 21, 2010

Related U.S. Application Data

(63) Continuation-in-part of application No. 12/212,742, filed on Sep. 18, 2008, now abandoned.

(60) Provisional application No. 61/149,200, filed on Feb. 2, 2009.

(30) Foreign Application Priority Data

Jul. 18, 2008 (GB) .................................. 0813196.3

(51) Int. Cl.
*G03F 7/00* (2006.01)
*G03F 7/004* (2006.01)
*G03F 7/20* (2006.01)
*G03F 7/40* (2006.01)

(52) U.S. Cl. ...................... 430/270.1; 430/311; 430/317; 430/318; 430/945

(58) Field of Classification Search ............... 430/270.1, 430/311, 945, 317, 318, 5
See application file for complete search history.

(56) References Cited

U.S. PATENT DOCUMENTS

| | | | |
|---|---|---|---|
| 4,528,259 A | 7/1985 | Sullivan | |
| 4,610,941 A | 9/1986 | Sullivan | |
| 4,720,798 A | 1/1988 | Reed et al. | |
| 4,888,270 A | 12/1989 | Sullivan | |
| 4,954,421 A | 9/1990 | Sullivan | |
| 6,339,197 B1 | 1/2002 | Fushie et al. | |
| 6,661,084 B1 | 12/2003 | Peterson et al. | |
| 7,309,563 B2 * | 12/2007 | Paul et al. | 430/322 |
| 7,470,865 B2 | 12/2008 | Fushie et al. | |
| 7,629,017 B2 | 12/2009 | Kodas et al. | |
| 7,955,783 B2 * | 6/2011 | Shrader et al. | 430/311 |
| 2004/0056939 A1 | 3/2004 | Thavarajah et al. | |
| 2004/0131782 A1 | 7/2004 | Hasei et al. | |
| 2005/0058945 A1 | 3/2005 | Fey et al. | |
| 2006/0213870 A1 | 9/2006 | Waldrop et al. | |
| 2009/0123873 A1 | 5/2009 | Shrader et al. | |
| 2009/0263162 A1 | 10/2009 | Sharma et al. | |
| 2010/0015409 A1 * | 1/2010 | Hamilton et al. | 428/195.1 |
| 2010/0155974 A1 * | 6/2010 | Oliveira et al. | 264/1.38 |

FOREIGN PATENT DOCUMENTS

| | | |
|---|---|---|
| GB | 2 179 756 A | 3/1987 |
| WO | 2005022969 A2 | 3/2005 |
| WO | 2008069565 A1 | 12/2008 |

OTHER PUBLICATIONS

Co-pending U.S. Appl. No. 12/212,742.

* cited by examiner

*Primary Examiner* — Amanda C. Walke

(74) *Attorney, Agent, or Firm* — Hultquist, PLLC; David Bradin

(57) ABSTRACT

There is herein described a method and apparatus for photoimaging. In particular, there is described a method and apparatus for photoimaging a substrate covered with a wet curable photopolymer, wherein the photoimaged substrate is used to form images such as electrical circuits.

32 Claims, 7 Drawing Sheets

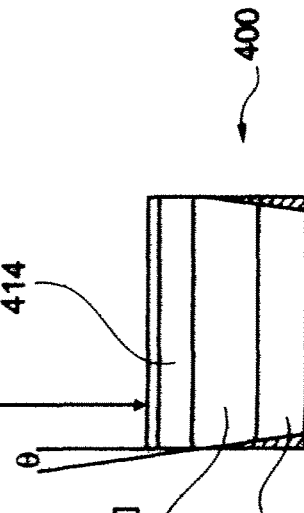
Fig. 6a
Fig. 6b
When θ = 6° and image is a 20 micron track width; then undercut A = 14.5 microns and undercut B = 0.84 microns.

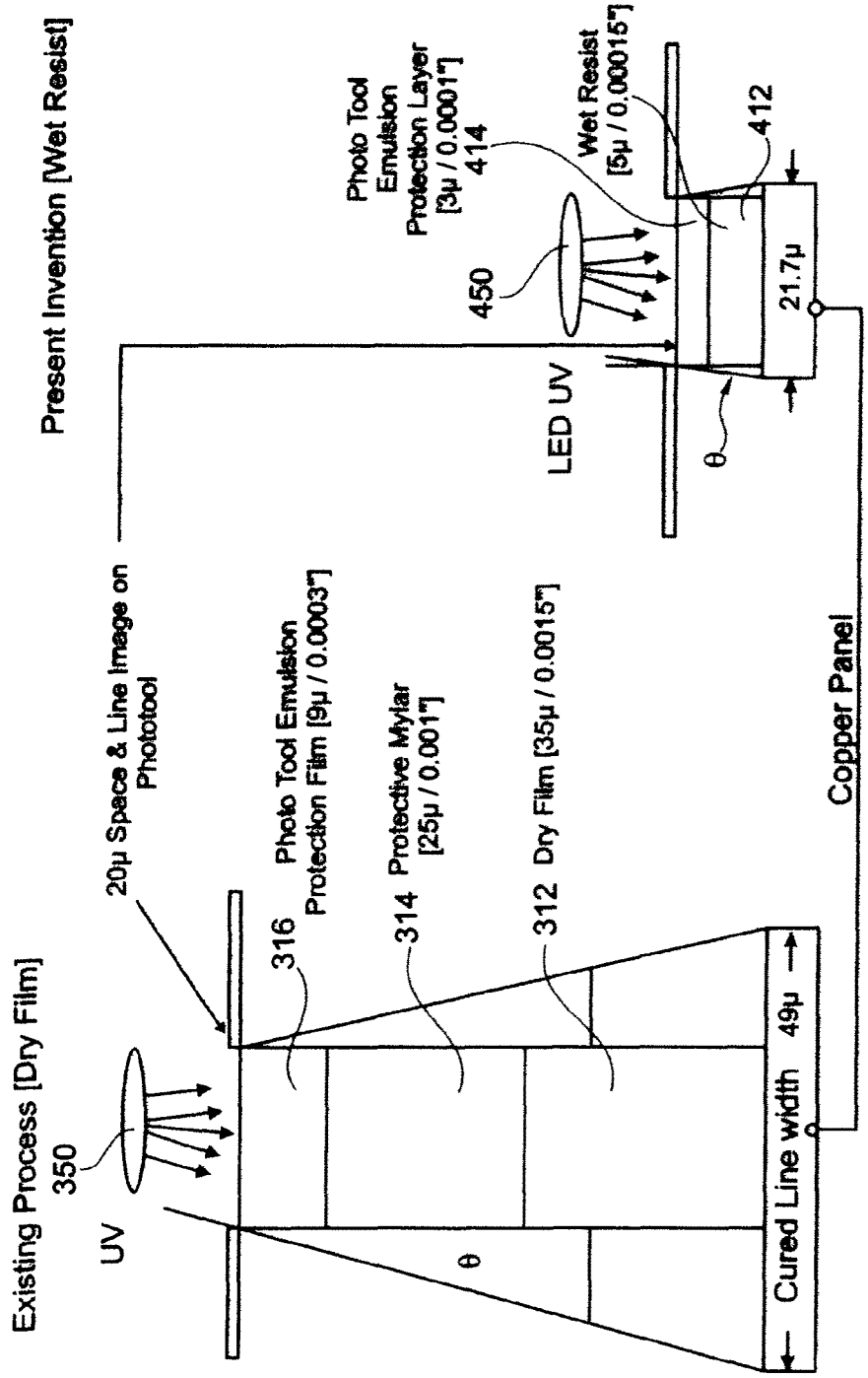
Fig. 7a  Existing Process [Dry Film]
Fig. 7b  Present Invention [Wet Resist]
When θ = 6° and image is a 20 micron Space width; then cured Line width A = 49 microns and cured Line width B = 21.7 microns.

PHOTOIMAGING METHOD AND APPARATUS

CROSS REFERENCE TO RELATED APPLICATIONS

This is a continuation-in-part of U.S. patent application Ser. No. 12/212,742 filed Sep. 18, 2008, which itself claims priority of United Kingdom Patent Application No. 0813196.3, filed Jul. 18, 2008. This application also claims priority under 35 U.S.C. §119 of United Kingdom Patent Application No. 0813196.3, filed Jul. 18, 2008 and under 35 U.S.C. §120 of U.S. Provisional Patent Application No. 61/149,200 filed Feb. 2, 2009. The disclosures of all of the foregoing applications are hereby incorporated herein by reference in their respective entireties, for all purposes.

FIELD OF THE INVENTION

The present invention relates to a method and apparatus for photoimaging. More particularly, the present invention relates to a method and apparatus for photoimaging a substrate covered with a wet curable photopolymer, wherein the photoimaged substrate is used to form images such as electrical circuits.

BACKGROUND OF THE INVENTION

Although prior techniques exist in the art for producing thin lines suitable for forming PCBs, many of these techniques suffer from a number of significant disadvantages. For example, many previous techniques suffer from poor resolution. Moreover, techniques which do provide high resolution usually require complex apparatus such as sophisticated laser equipment. A further problem is that previous techniques have required the use of partially cured dry films of photopolymer which are usually supported on a polyester (e.g. Mylar) film. The thickness of these dry films has a detrimental effect on the resolution and/or definition of photoimaged surfaces as this allows unwanted undercutting (i.e. light shadowing) to occur during the photoimaging process. There are also problems in adhering partially cured dry films to substrates and contamination problems which once again causes problems in the photoimaging process. Partially cured dry films are also expensive when used in large quantities. Such systems are described in U.S. Pat. No. 4,888,270 and U.S. Pat. No. 4,954,421, which are incorporated herein by reference.

It is an object of at least one aspect of the present invention to obviate or mitigate at least one or more of the aforementioned problems.

It is a further object of at least one aspect of the present invention to provide an improved method for photoimaging surfaces.

It is a yet further object of at least one aspect of the present invention to provide a cost efficient method for producing electrical circuits with high resolution and small track widths (i.e. fine lines).

It is a further object of at least one aspect of the present invention to provide a cost efficient method for producing high density electrical circuits suitable for PCBs.

It is a further object of at least one aspect of the present invention to provide an improved method for photoimaging surfaces with high resolution and small track widths over a large area.

It is a further object of at least one aspect of the present invention to provide a method for imaging an ink jet deposit of conductive material.

SUMMARY OF THE INVENTION

According to a first aspect of the present invention there is provided a method for photoimaging a substrate, said method comprising:
providing a substrate with a cladding;
depositing a liquid photoresist polymer on at least part of the cladding to form a film of photoresist polymer with a thickness of less than about 178 μm (0.007 inch);
positioning a phototool onto the liquid photoresist polymer; and
applying radiation to the liquid photoresist polymer to cure the photoresist layer in exposed areas through the phototool.

The present invention therefore relates to a method of photoimaging a substrate covered with a wet curable photopolymer (i.e. a wet resist), wherein the photoimaged substrate may be used to form electrical circuits such as PCBs and flat panel displays. The present invention may also relate to forming dielectric images on dielectrics. In contrast to many prior art techniques, the present invention therefore relates to the use of wet films rather than expensive dry films such as Mylar™. Dry films are considerably more expensive than the use of wet films. The use of wet films also overcomes the need for curing of the wet films and therefore leads to a very controllable process.

In the present invention there is also no drying step (i.e. a pre-drying step) before the film of wet photoresist polymer is irradiated with, for example, UV radiation. This is in complete contrast to prior art techniques which dry a wet film before irradiation occurs.

The cladding may be made from or comprises any appropriate material or composite and may, for example, be metallic or non-metallic. In particular embodiments, there may therefore be metallic cladding and in alternative embodiments there may be non-metallic cladding.

The cladding may extend at least partially around or fully around the substrate. Alternatively, the substrate may comprise a first and second side and the cladding may extend over one or both of the first and second sides of the substrate. The substrate may therefore be laminated with the cladding over one or both of the first and second sides of the substrate. The cladding may be in the form of a film or layer which is attached and/or adhered to the substrate.

Typically, the metal cladding may comprise or consist of conductive material. The substrate which may, for example, be a dielectric material which may therefore be fully or at least substantially encapsulated by the metal cladding. The metal cladding may comprise or consist of conducting material such as any suitable metal material. Suitable metals may, for example, be copper, silver, gold and the like.

In embodiments where the cladding is non-metallic, the cladding may comprise or consist of dielectric material.

The substrate with the cladding may be substantially flat and may range in size up to about 1 m×1 m. The present invention has the advantage in that there is, in effect, no size limitation on the substrate apart from the apparatus actually performing the photoimaging process.

The liquid photoresist polymer is in a wet form (i.e. in a flowable form). The physical properties of the liquid photoresist polymer may be matched to the required curing properties.

Typically, the liquid photoresist polymer may be deposited with a thickness of less than or equal to about 150 μm, 125 μm, 100 μm, 75 μm, 50 μm, 25 μm, 10 μm, 5 μm, 1 μm, 0.5 μm or 0.1 μm. Alternatively, the liquid photoresist polymer may be deposited with a thickness ranging from about 177 μm to about 0.1 μm, about 125 μm to about 0.1 μm, about 100 μm to about 0.1 μm, about 75 μm to about 0.1 μm, about 50 μm to about 0.1 μm, about 25 μm to about 0.1 μm or about 10 μm to about 0.1 μm. Preferably, the liquid photoresist polymer may have a thickness of about 5 μm.

By the use of thin liquid photoresist polymer films allows low intensity radiation (e.g. UV light) to be used in the photoimaging process.

The liquid photoresist polymer may be applied to only one or both the first and second sides of the substrate wherein both the first and second sides of the substrate comprise cladding. The present invention may therefore relate to a single-sided or a double-sided exposure in, for example, a front to back registration.

The liquid photoresist polymer may be deposited in a substantially even and continuous manner using any suitable technique. For example, the liquid photoresist layer may be deposited using a spray, a brush, a roller and/or a dip coating system.

Prior to application of the liquid photoresist polymer, the substrate comprising the cladding may be cleaned using a contact cleaning process to remove debris and/or contamination from the surface of the cladding.

Once the liquid photoresist polymer has been applied to the substrate with the cladding, the phototool may be positioned onto the substrate. A compressive force may then be applied to the deposited liquid photoresist polymer. By applying a compressive force, the liquid photoresist polymer may be spread out and/or squeezed so that a substantially even, continuous film of photoresist may be achieved with a substantially even thickness. In particular embodiments, a roller based system may be used to apply a compressive rolling force and may therefore be used to spread the liquid photoresist polymer. Typically, a rubber cylindrical roller may be rolled over the phototool which applies the compressive to the liquid photoresist polymer. The spreading out and/or squeezing may occur on both sides of the substrate at substantially the same time. A particular function of the spreading out and/or squeezing is that this helps to ensure that substantially no air and therefore substantially no oxygen is trapped underneath the liquid photoresist polymer. It is preferred that there is no air and no oxygen trapped underneath the liquid photoresist polymer. This overcomes the need to have complex light systems and also provides significant improvements to the speed of the process as trapped oxygen slows down the photoimaging (i.e. curing) process.

A phototool is used in the photoimaging process. The phototool may be a negative or positive image of desired electrical circuitry and may allow light to pass through some parts of the phototool but not others. The phototool may be made from flexible plastics material and may be connected to a mechanism which correctly positions the phototool on the substrate on at least one or both sides of the substrate. The phototool may be tensioned and wound around rollers such as solid steel rollers. In particular embodiments, the phototool may also comprise a protective layer which may facilitate the phototool being peeled off the substrate after the imaging has taken place. The protective layer may be any suitable non-stick material. The phototool has the further advantage in that this provides the ability to control the temperature and humidity during the photoimaging process and along the full length of the photoimaged area. This allows the temperature and humidity to be maintained at substantially constant levels which provides a very controllable process.

The radiation used may be any suitable radiation which cures the liquid photoresist polymer. In particular embodiments, UV radiation may be used to polymerise and/or harden and/or set the exposed liquid (e.g. wet) photoresist polymer.

The UV radiation may have a wavelength of about 200-400 nm and may have an intensity matched to cure the photopolymer being used. A particularly preferred UV light source may be UV LEDs as they produce very small amounts of heat, have a long lamp life, start up immediately, have substantially no fall-off in power output, are low maintenance and can produce high levels of light intensity. LEDs may therefore be used to print fine lines in an inexpensive photoimaging process according to the present invention. An alternative light source may be a laser light source.

In particular embodiments of the present invention, the radiation may be collimated to improve the quality and/or resolution and/or definition of the photoimaging process.

At least one or both phototools may be accurately lined up using a registration system on one or both sides of the substrate. The substrate may be positioned substantially vertically as at least one or both phototools are applied.

The photoimaging apparatus of the present invention may be used to process about one panel of substrate about every ten seconds.

After applying the radiation of the photoimaging process, liquid photoresist polymer which has not been exposed to radiation may be removed using standard wash off processes.

The method of the present invention may also be self-contained in a mini-clean room which therefore provides significant cost savings in the photoimaging process as large industrial clean rooms are not required.

Using the method as described in the present invention, high definition fine lines suitable for electrical circuitry may be obtained. The fine lines may have a width of any of the following: less than or equal to about 200 μm; less than or equal to about 150 μm; less than or equal to about 140 μm; less than or equal to about 130 μm; less than or equal to about 120 μm; less than or equal to about 110 μm; less than or equal to about 100 μm; less than or equal to about 90 μm; less than or equal to about 80 μm; less than or equal to about 75 μm; less than or equal to about 70 μm; less than or equal to about 60 μm; less than or equal to about 50 μm; less than or equal to about 40 μm; less than or equal to about 30 μm; less than or equal to about 20 μm; less than or equal to about 10 μm; or less than or equal to about 5 μm. Alternatively the fine lines may have a width of any of the following: greater than about 200 μm; greater than about 150 μm; greater than about 100 μm; greater than about 75 μm; greater than about 50 μm; greater than about 20 μm; or greater than about 10 μm. Alternatively the fine lines may have a width of any of the following: about 0.1-200 μm; about 1-150 μm; about 1-100 μm; about 20-100 μm or about 5-75 μm. The fine lines may be used in PCBs and other electrical components such as flat screen displays.

The method of the present invention may have the added advantage in that all steps such as the deposition of the liquid photoresist polymer and the removal of the phototool may occur in a single pass through apparatus according to the present invention. For example, the depositing of a liquid photoresist polymer on at least one or both sides of the substrate, the positioning of phototool(s) over the liquid photoresist polymer on at least one or both sides of the substrate, the application of a compressive force to the deposited liquid photoresist polymer to form a film of photoresist polymer, and the application of radiation to the liquid photoresist polymer to cure the photoresist layer may all occur in a single pass through photoimaging apparatus of the present invention. This one-step process therefore increases the throughput of photoimaged substrates through the apparatus and also provides an apparatus which is easy to control and monitor.

The present invention has a number of advantages which are obtained by photoimaging through a much smaller depth in comparison to the prior art. For example, the depth formed by the thin film of photoresist polymer and optionally a protective layer for the phototool may be about through which the photoimaging may occur may be any of the following: about 0.1-50 µm; about 1-50 µm; about 1-25 µm; about 1-10 µm; about 1-8 µm or about 1-5 µm. Typically, the depth formed by the thin film of photoresist polymer and optionally a protective layer for the phototool may be about 8 µm. By having a relatively small depth through which the photoimaging occurs provides reduced undercut and allows very small line widths to be formed. The amount of undercut occurring in the present invention, using for example an illumination angle θ to the vertical (see FIGS. 6a and 6b) may be any of the following: less than about 10 µm; less than about 5 µm; less than about 2 µm; less than about 1 µm; less than about 0.84 µm; less than about 0.8 µm; less than about 0.5 µm; or less than about 0.25 µm.

According to a second aspect of the present invention there is provided a method for photoimaging a substrate, said method comprising:

providing a substrate with a cladding;

depositing a liquid photoresist polymer on at least part of the cladding to form a thin film of photoresist polymer;

positioning a phototool onto the liquid photoresist polymer; and applying radiation to the liquid photoresist polymer to cure the photoresist layer in exposed areas through the phototool.

In the present invention there is also no drying step (i.e. a pre-drying step) before the film of wet photoresist polymer is irradiated with, for example, UV radiation.

According to a third aspect of the present invention there is provided photoimaged circuits formed according to the first or second aspect.

Typically, the photoimaged circuits may be electrical circuits which may be used in the manufacture of, for example, PCBs and flat panel displays.

According to a fourth aspect of the present invention there is provided dielectric images on dielectrics formed according to the first or second aspect.

According to a fifth aspect of the present invention there is provided apparatus for photoimaging a substrate, said apparatus comprising:

at least one phototool capable of being positioned onto a liquid photoresist polymer on at least one side of a substrate with a cladding;

a roller capable of applying a compressive force to the liquid photoresist polymer on the substrate with the cladding to form a film of photoresist polymer with a thickness of less than about 178 µm (0.007 inch); and a radiation source capable of curing the liquid photoresist polymer.

The cladding may be made from or comprises any appropriate material or composite and may, for example, be metallic or non-metallic.

In the present invention there is also no drying step (i.e. a pre-drying step) before the film of wet photoresist polymer is irradiated with, for example, UV radiation. The apparatus therefore does not comprise apparatus for pre-drying the wet film of photoresist polymer before applying the film to the radiation source.

The fine lines may have a width of any of the following: less than or equal to about 200 µm; less than or equal to about 150 µm; less than or equal to about 140 µm; less than or equal to about 130 µm; less than or equal to about 120 µm; less than or equal to about 110 µm; less than or equal to about 100 µm; less than or equal to about 90 µm; less than or equal to about 80 µm; less than or equal to about 75 µm; less than or equal to about 70 µm; less than or equal to about 60 µm; less than or equal to about 50 µm; less than or equal to about 40 µm; less than or equal to about 30 µm; less than or equal to about 20 µm; less than or equal to about 10 µm; or less than or equal to about 5 µm. Alternatively the fine lines may have a width of any of the following: greater than about 200 µm; greater than about 150 µm; greater than about 100 µm; greater than about 75 µm; greater than about 50 µm; greater than about 20 µm; or greater than about 10 µm. Alternatively the fine lines may have a width of any of the following: about 0.1-200 µm; about 1-150 µm; about 1-100 µm; about 20-100 µm or about 5-75 µm. The fine lines may be used in PCBs and other electrical components such as flat screen displays.

Typically, the compressive force may be applied onto at least one or both phototools whereupon the phototool(s) applies the compressive force to the liquid photoresist polymer.

The apparatus may also comprise collimating means to collimate radiation emitting from the radiation source.

In particular embodiments, the radiation source may comprise LEDs and/or a laser light source. Preferably, the radiation source may be capable of emitting UV radiation.

The apparatus may also comprise positioning means to locate the at least one phototool on the substrate.

The apparatus of the present invention also has the advantage of having a small footprint. This makes the apparatus extremely adaptable. For example, the apparatus may have a footprint of about 5 m×2 m or even smaller.

The apparatus of the present invention may also have a low power consumption due to there being no curing process required for the wet film (i.e. no pre-drying step). The apparatus may therefore be operated at low power such as less than about 10 kW or preferably less than about 5 kW. In comparison, prior art techniques operate in the region of greater than about 100 kW. The apparatus of the present invention may therefore provide about a 50 times or even about a 100 times improvement in energy consumption. The apparatus may therefore have a low environmental impact.

The apparatus of the present invention may also operate at a high capacity such as about 100-500 panels per hour or typically at about 360 panels per hour.

The apparatus may also be fully automated and therefore requires the minimum of handling. The apparatus may also be easy to maintain.

According to a seventh aspect of the present invention there is provided apparatus for photoimaging a substrate, said apparatus comprising:

at least one phototool capable of being positioned onto a liquid photoresist polymer on at least one side of a substrate with a cladding;

a roller capable of applying a compressive force to the liquid photoresist polymer on the substrate with the cladding to form a thin film of photoresist polymer; and a radiation source capable of curing the liquid photoresist polymer.

The apparatus does not comprise apparatus for pre-drying the wet film of photoresist polymer before applying the film to the radiation source.

According to an eighth aspect of the present invention there is provided a method for producing tracks and/or electrical circuitry on a substrate, said method comprising:

providing a substrate;

providing ink jet deposits on at least one side of the substrate, said ink jet deposits comprising conductive particles;

depositing a liquid photoresist polymer on at least one side of the substrate comprising the ink jet deposits;

positioning a phototool onto the liquid photoresist polymer on at least one side of the substrate;

applying a compressive force to the deposited liquid photoresist polymer to form a film of photoresist polymer with a thickness less than about 178 μm (0.007 inch); and applying radiation to the liquid photoresist polymer to cure the photoresist layer in exposed areas through the phototool.

Typically, the ink jet deposits may comprise conductive particles such as silver, gold and/or copper.

In the present invention there is also no drying step (i.e. a pre-drying step) before the film of wet photoresist polymer is irradiated with, for example, UV radiation.

The ink jet deposits may have a width of about 50 μm-500 μm, 50 μm-250 μm, 75 μm-150 μm or typically about 100 μm. The ink jet deposits may therefore be modified using the photoimaging concept described in the present invention. For example, the ink jet deposits may be formed on a substrate of, for example, a plastics sheeting. The ink jet deposits may form an approximate required track on the plastics sheeting. Typically, at least one or multiple tracks may then be formed within the ink jet deposits using the photoimaging concept described in the present invention.

According to an ninth aspect of the present invention there is provided apparatus for photoimaging a substrate, said apparatus comprising:

at least one phototool capable of being positioned onto a liquid photoresist polymer on at least one side of a substrate with a cladding;

a roller capable of applying a compressive force to the liquid photoresist polymer on the substrate with the cladding to form a thin film of photoresist polymer; and a radiation source capable of curing the liquid photoresist polymer.

In the present invention there is also no drying step (i.e. a pre-drying step) before the film of wet photoresist polymer is irradiated with, for example, UV radiation.

BRIEF DESCRIPTION OF THE DRAWINGS

Embodiments of the present invention will now be described, by way of example only, with reference to the accompanying drawings in which:

FIG. 6a is a sectional view of a photoimaging process according to the prior art showing undercut occurring;

FIG. 6b is a sectional view of a photoimaging process according to an embodiment of the present invention undercut occurring;

FIG. 7a is a sectional view of a photoimaging process according to the prior art showing cured line width; and FIG. 7b is a sectional view of a photoimaging process according to an embodiment of the present invention showing cured line width.

BRIEF DESCRIPTION

Figure 1:
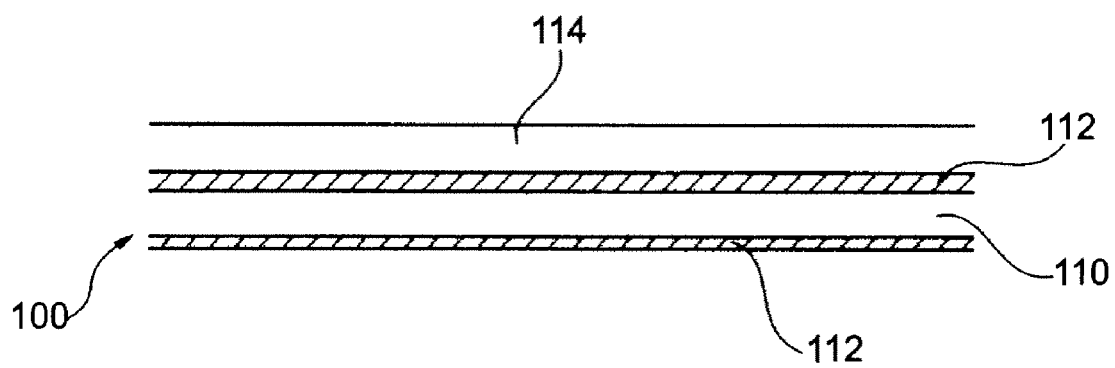
FIG. 1 is a sectional side view of a substrate with a wet photoresist layer deposited thereon according to an embodiment of the present invention.

FIG. 1 is a sectional side view of a laminated structure, generally designated 100 according to an embodiment of the present invention. The laminated structure 100 comprises a substrate 110 such as a dielectric layer and a metal cladding 112 on both sides. (Although the description below is for a metal cladding it should be noted that a similar process may be used for a non-metallic cladding). On top of the laminated structure 100 there is a layer of a liquid photoresist polymer 114. The photoresist layer 114 is therefore wet. The liquid photoresist polymer layer 114 has a thickness of about 5 μm. Although not shown in FIG. 1, the photoresist layer 114 may be applied to both sides of the laminated structure 100.

The photoresist layer 114 is first of all deposited in a substantially even and continuous or at least substantially continuous manner using any suitable technique onto the laminated structure 100. For example, the photoresist layer 114 is applied using a spray, a brush, a roller and/or a dip coating system. In the present invention there is no drying step (i.e. a pre-drying step) before the film of wet photoresist polymer is irradiated with, for example, UV radiation.

Once the photoresist layer 114 has been applied to the laminated structure 100, a phototool 116 is applied to the photoresist layer 114. The phototool 116 is a negative (or positive) image of a desired electrical circuitry and allows light to pass through some parts of the phototool 116 but not others. The phototool is made from flexible plastics material.

Figure 2:
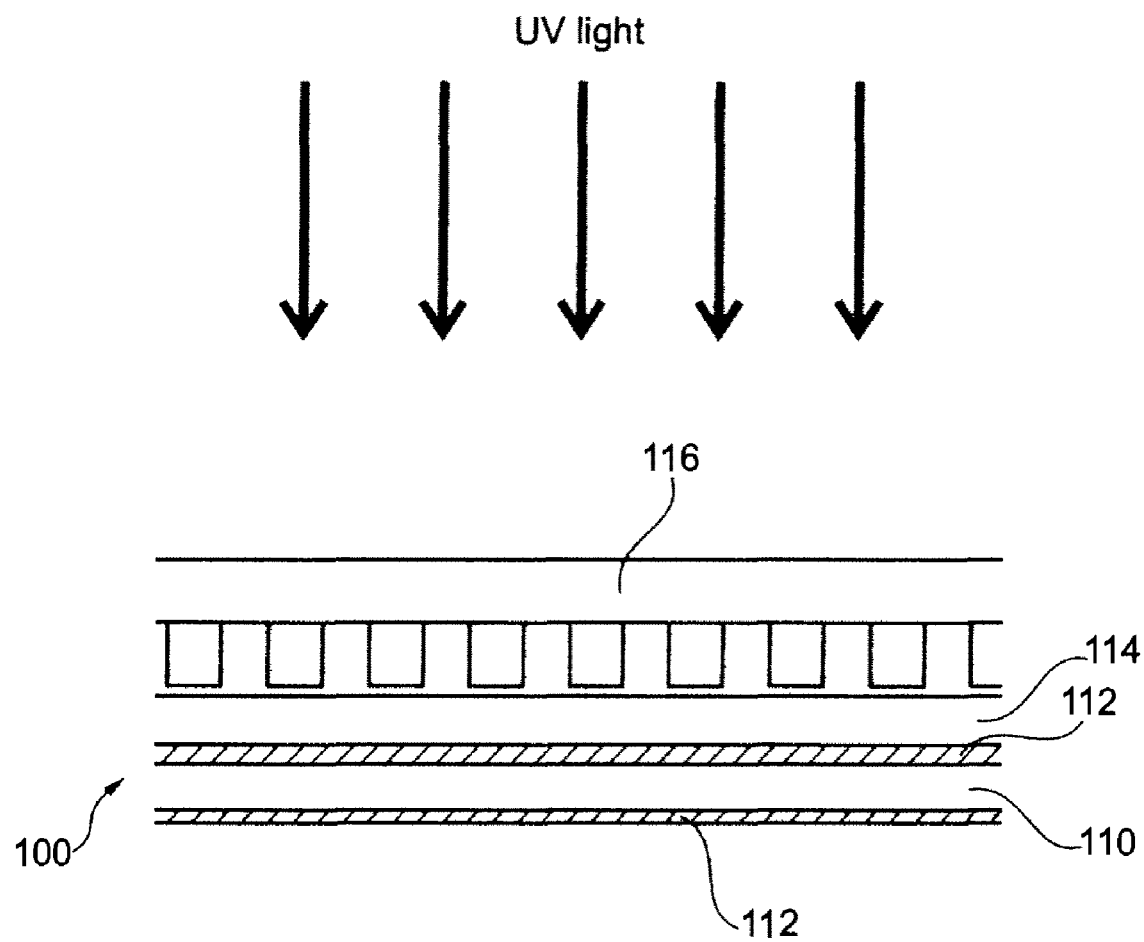
FIG. 2 is a sectional side view of the substrate with the wet photoresist layer shown in FIG. 1 wherein a phototool is being used in a photoimaging process according to an embodiment of the present invention.

FIG. 2 represents the phototool 116 being applied to the laminated structure 100. After the phototool 116 has been applied to the laminated structure 100 comprising the liquid photoresist layer 114, a compression system is used to spread out and/or squeeze the photoresist layer 114 so that an even spread of the photoresist layer 114 is achieved with a substantially even thickness of about 5 μm. The compression system also ensures that no air and hence oxygen is trapped underneath the photoresist layer 114. For example, a roller based system applies a compressive force and is used to spread the photoresist layer 114. A rubber cylindrical roller may therefore be used to spread the photoresist layer 114. This may occur on both sides of the laminated structure 100. This overcomes the need to have complex light systems including parabolic mirrors as all air and oxygen is eliminated.

As shown in FIG. 2, UV radiation is used to polymerise and/or harden and/or set the exposed liquid photoresist layer 114. The UV radiation has a wavelength of about 200-400 nm and has an intensity matched to cure the exposed liquid photoresist layer 114. Any suitable UV light source may be used but UV LEDs are particularly suitable as they produce very small amounts of heat, have a long lamp life, start up immediately, have substantially no fall-off in power output, are low maintenance and can produce high levels of light intensity. LEDs can therefore be used to print fine lines in an inexpensive photoimaging process. Alternatively, a laser light source is used. A significant advantage to note is that no partially cured dry films of photopolymer (e.g. Mylar) are required which therefore significantly reduces any undercutting of the light (i.e. light shadows) during the imaging process which will have a detrimental effect on the resolution. The resolution of the method of the present invention is therefore enhanced by overcoming the need to have no partially cured dry films.

Figure 3:
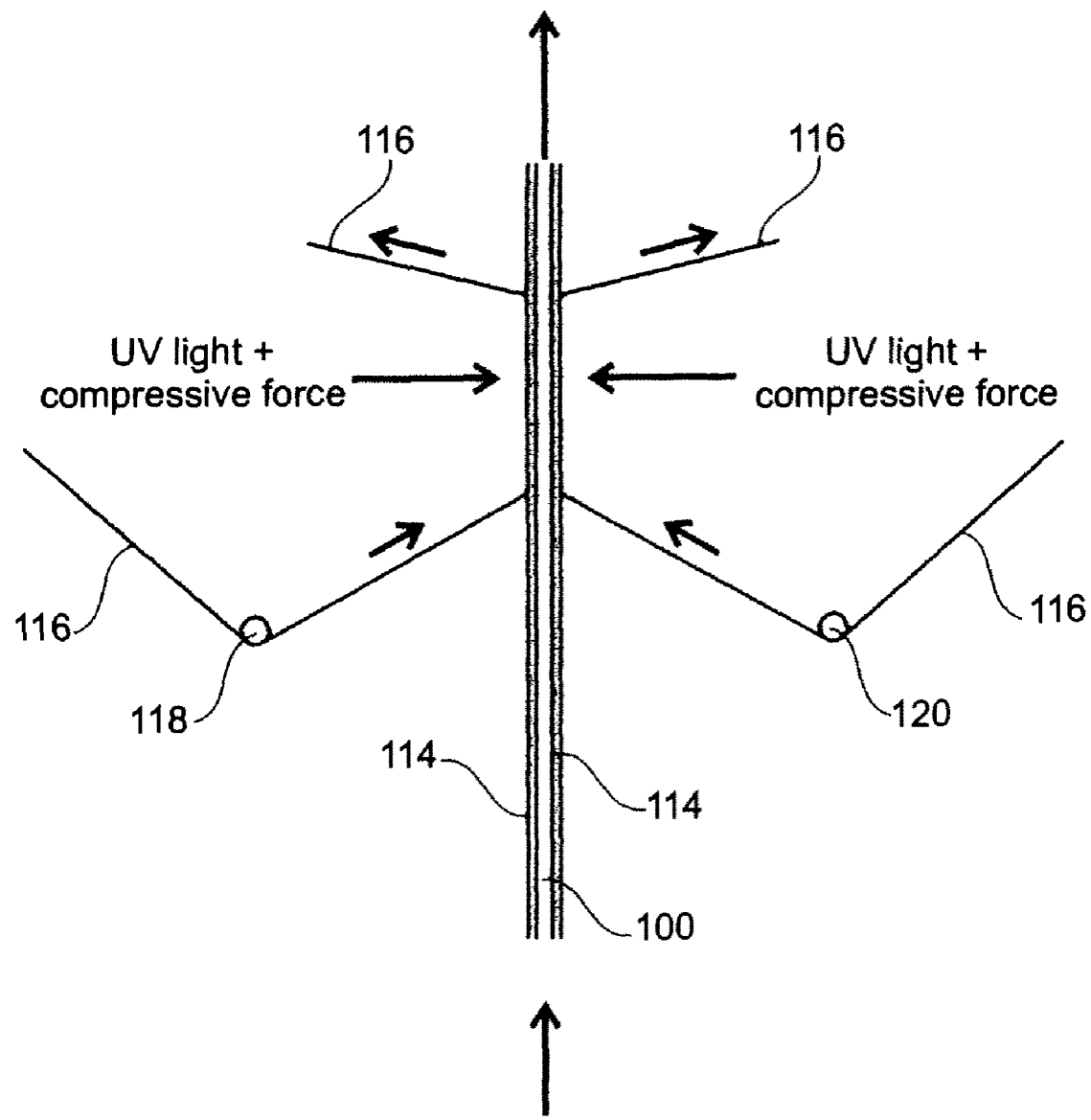
FIG. 3 is a view of a processing step in the photoimaging process where phototools are being applied to both sides of the substrate during the photoimaging process according to an embodiment of the present invention.

FIG. 3 is a representation of photoimaging apparatus according to the present invention which shows the laminated structure 100 being drawn substantially vertically up into the apparatus wherein phototools 116 are applied to both sides of the laminated structure 100. The phototools 116 are tensioned and extend around rollers 118,120. Advantageously, the phototools 116 have a surface attraction to the photoresist layers 114 and can therefore 'self-stick' to the photoresist layers 114 via weak interactive forces such as van der Waals and/or electrostatic forces. The phototools 116 may also comprise a protective non-stick layer which facilitates the removal (i.e. peeling) of the phototools 116 from the laminated structure 100 once imaging has occurred.

Although not shown, a registration system is used to accurately line up the phototools 116 on both sides of the laminate structure.

The photoimaging apparatus can be used to process about one panel of laminated structure 100 every ten seconds. Once the photoimaging has occurred, the phototools 116 are removed from the laminated structure 100 using any suitable mechanical means. The photoimaging process is extremely quick as no air and oxygen is trapped under the liquid photoresist layer 114. This therefore provides a drying time of less than about 5 seconds or preferably less than 1 second for the photoresist layer 114.

After the photoimaging process, liquid photoresist 114 which has not been exposed to UV radiation is removed using, for example, an aqueous alkali solution via a washing procedure. A standard chemical etching process may then be used. For example, acid or alkali may be used to produce a dielectric substrate containing the required metal (e.g. copper) circuitry covered by polymerised photoresist. The polymerised photoresist can then be removed to yield a substrate with the required electrical conductive circuitry.

The apparatus as described in the present invention can also be fully contained in a mini-clean room which therefore provides significant cost savings in the photoimaging process.

Using the method as described in the present invention high definition fine lines suitable for electrical circuitry are obtained. The fine lines have a width of any of the following: less than or equal to about 200 μm; less than or equal to about 150 μm; less than or equal to about 140 μm; less than or equal to about 130 μm; less than or equal to about 120 μm; less than or equal to about 110 μm; less than or equal to about 100 μm; less than or equal to about 90 μm; less than or equal to about 80 μm; less than or equal to about 75 μm; less than or equal to about 70 μm; less than or equal to about 60 μm; less than or equal to about 50 μm; less than or equal to about 40 μm; less than or equal to about 30 μm; less than or equal to about 20 μm; less than or equal to about 10 μm; or less than or equal to about 5 μm. Alternatively the fine lines have a width of any of the following: greater than about 200 μm; greater than about 150 μm; greater than about 100 μm; greater than about 75 μm; greater than about 50 μm; greater than about 20 μm; or greater than about 10 μm. Alternatively the fine lines have a width of any of the following: about 0.1-200 μm; about 1-150 μm; about 1-100 μm; about 20-100 μm or about 5-75 μm.

The fine lines are used in PCBs and other electrical components such as flat screen displays.

Figure 4A:
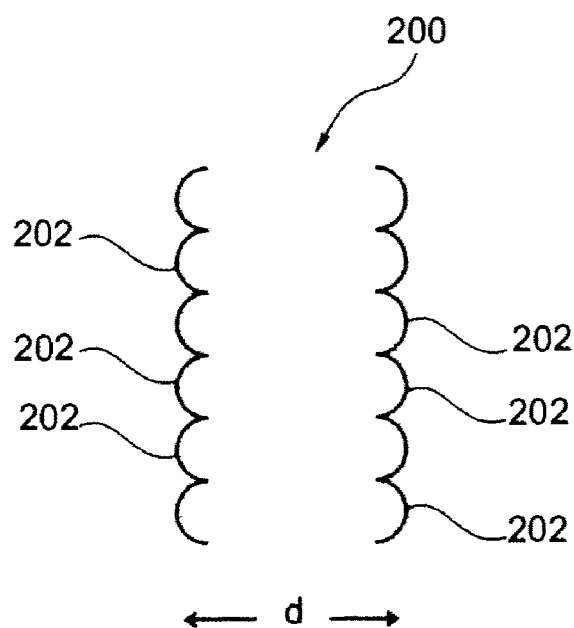
FIGS. 4a and 4b are representations of an alternative photoimaging process according to a further embodiment of the present invention.
Figure 4B:
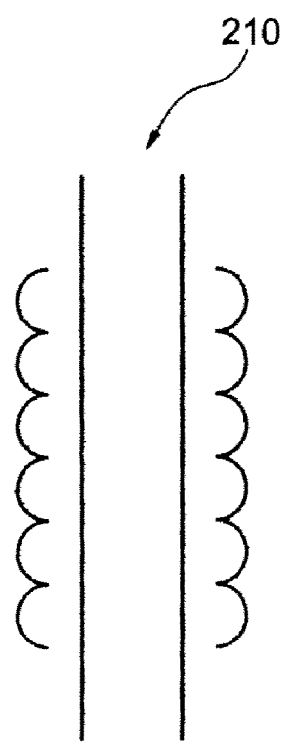

FIGS. 4a and 4b are representations of an alternative photoimaging process according to the present invention. FIG. 4a represents a deposit of ink from an ink jet, the ink jet deposit is generally designated 200. The ink jet deposit 200 comprises conductive particles such as silver, gold and/or copper and is therefore conductive. As shown in FIG. 4a, the ink jet deposit 200 does not have straight sides but has a series of outer undulations 202 due to the ink being deposited in a series of small droplets. The ink jet deposit 200 has a width 'd' of about 100 μm. Using such ink jet deposits 200 it is difficult to form fine tracks for electrical circuits. However, the ink jet deposits 200 can be modified using the photoimaging concept described in the present invention. For example, the ink jet deposits 200 can be formed on a plastics sheeting. The ink jet 200 deposit is used to form the approximate required electrical conductive track onto the plastics sheeting. The process as described above is then used to improve the quality of the formed track. A photoresist layer as described above is applied over the plastics sheeting. A phototool is then applied to the plastics sheeting, a compressive force is applied and then radiation. As shown in FIG. 4b, the applied photoimaging can be used to produce an improved track 210 within the ink jet deposit 200. For example, if the ink jet deposit 200 has a width 'd' of about 100 μm, multiple separate high resolution tracks can be formed within the previous single track formed by the ink jet deposit. For example, four tracks can be formed within a 100 μm ink deposit track.

Figures 5A, 5B:
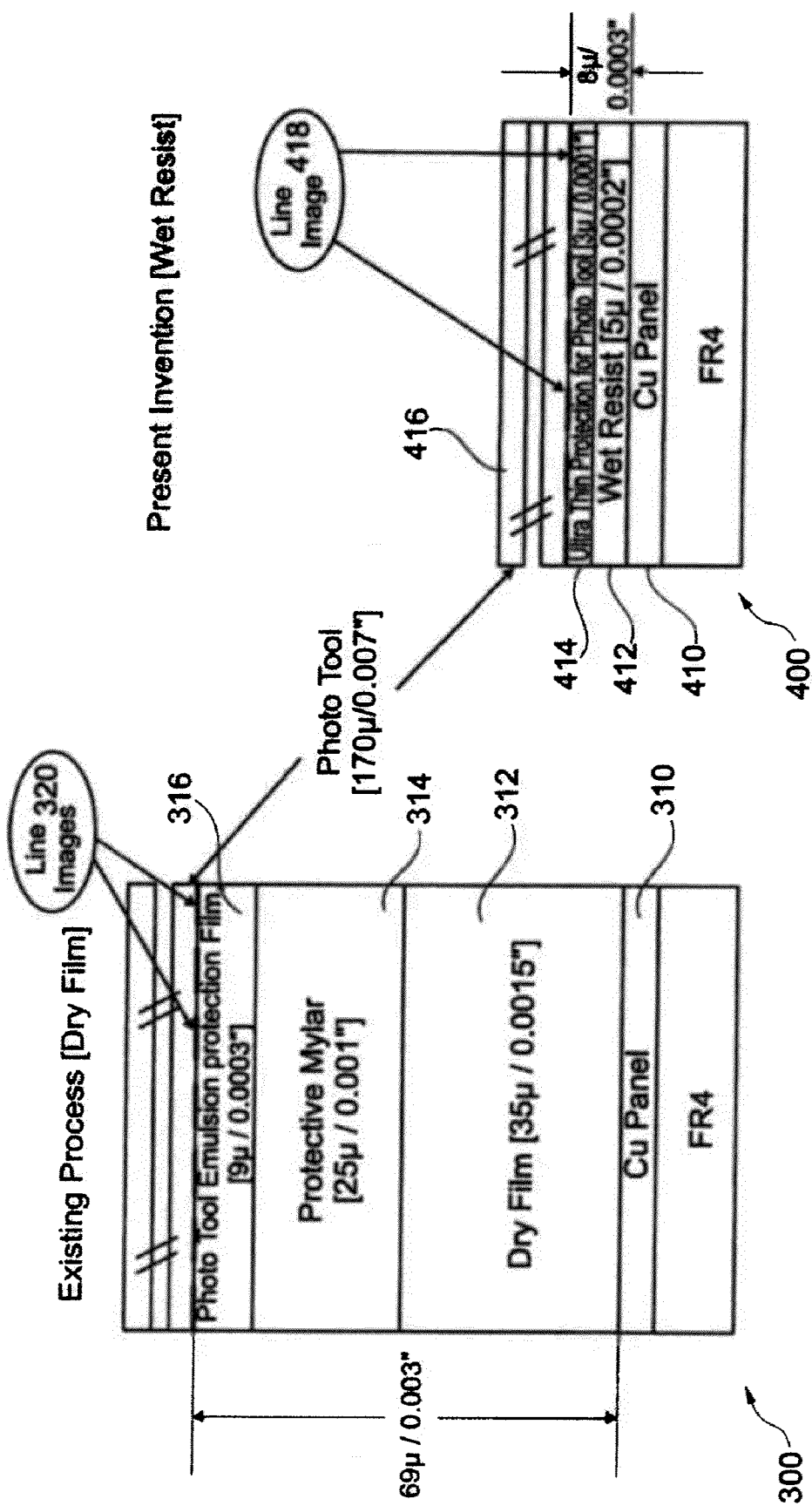
FIG. 5a is a sectional view of a photoimaging process according to the prior art.
FIG. 5b is a sectional view of a photoimaging process according to an embodiment of the present invention.

FIGS. 5a and 5b are comparisons of existing prior art processes and the process of the present invention. FIG. 5a relates to a prior art process which is generally designated 300. FIG. 5a shows that there is a copper panel 310 with a dry film layer 312 with a thickness of about 35 μm residing on top of the copper panel 310, a protective Mylar layer 314 with a thickness of about 25 μm and an emulsion protective film 316 with a thickness of about 9 μm used with a phototool 318. The formed thin line or track images 320 are also shown. FIG. 5b relates to a process according to the present invention which is generally designated 400. FIG. 5b shows that there is a copper panel 410, a wet resist layer 412 with a thickness of about 5 μm and an ultrathin protective film 414 with a thickness of about 3 μm used with a phototool 416. The formed thin line or track images 418 are also shown. FIGS. 5a and 5 clearly show that the process of the present invention provides a much smaller depth through which the photoimaging must occur. As shown the prior art process 300 images through a total thickness of about 69 μm whereas the process 400 of the present invention 300 images through a total thickness of about 8 μm. There is also no need for a Mylar layer.

FIGS. 6a and 6b illustrate a further advantage of the present invention relating to undercut. In FIG. 6a which is the process 300 of the prior art shows that there is a large amount of undercut of about 14.5 μm whereas in the process 400 of the present invention there is a small undercut of about 0.84 μm. The small undercut in the present invention is achieved by having a much reduced depth through which the photoimaging occurs. It should be noted that both FIGS. 6a and 6b relate to the comparison of the formation of a 5 μm track where θ=6°.

FIGS. 7a and 7b illustrate a yet further advantage of the present invention relating to cured line widths where a light source 350, 450 is used, respectively. Both FIGS. 7a and 7b relate to the comparison of the formation of a 20 μm space where θ=6°. In the prior art process 300 the resulting cured line width is 49 μm (representing a line growth of 145%) whereas the present invention process 400 the resulting cured line width is 21.7 μm (representing a line growth of only 8%).

Whilst specific embodiments of the present invention have been described above, it will be appreciated that departures from the described embodiments may still fall within the scope of the present invention. For example, any suitable type of substrate may be used. The cladding may also be metallic or non-metallic. Moreover, any suitable liquid photoresist polymer or combinations thereof may be used. Any mechanical means may also be used to apply a compressive force to the deposited liquid photoresist polymer to form a thin film of material with no trapped air and oxygen underneath. The radiation used may be of any appropriate wavelength which is capable of curing the liquid photoresist polymer.

The invention claimed is:

1. A method for photoimaging a substrate, said method comprising: providing a substrate with a cladding; depositing a liquid photoresist polymer on at least part of the cladding to form a film of photopolymer with a thickness of less than about 178 μm (0.007 inch); positioning a phototool or flexible plastics material onto the liquid photopolymer; and applying radiation to the liquid photopolymer to cure the photoresist layer in exposed areas through the phototool or flexible plastics material, wherein there is no drying or pre-curing step before the liquid photopolymer is exposed to the radiation to cure the photoresist layer in the exposed areas through the phototool or flexible plastics material.

2. A method for photoimaging a substrate according to claim 1, wherein the cladding is metallic or non-metallic.

3. A method for photoimaging a substrate according to claim 1, wherein the cladding comprises conductive material on a first and second side of the substrate.

4. A method for photoimaging a substrate according to claim 1, wherein the substrate is a dielectric material.

5. A method for photoimaging a substrate according to claim 1, wherein the cladding is metallic and comprises any one of or combination of the following: copper, silver and gold.

6. A method for photoimaging a substrate according to claim 1, wherein the substrate with the cladding is substantially flat and has a size of up to about 1 m×1 m.

7. A method for photoimaging a substrate according to claim 1, wherein the liquid photoresist polymer is deposited with a thickness of less than about 150 μm, 125 μm, 100 μm, 75 μm, 50 μm, 25 μm, 10 μm, 5 μm, 1 μm, 0.5 μm or 0.1 μm.

8. A method for photoimaging a substrate,
said method comprising: providing a substrate with a cladding; depositing a liquid photopolymer on at least part of the cladding to form a film of photopolymer with a thickness of less than about 178 μm (0.007 inch); positioning a phototool or flexible plastics material onto the liquid photopolymer; and applying radiation to the liquid photopolymer to cure the photoresist layer in exposed areas through the phototool or flexible plastics material,
wherein the liquid photopolymer is deposited with a thickness ranging from 5 μm to about 0.1 μm.

9. A method for photoimaging a substrate,
said method comprising: providing a substrate with a cladding; depositing a liquid photopolymer on at least part of the cladding to form a film of photopolymer with a thickness of less than about 178 μm (0.007 inch); positioning a phototool or flexible plastics material onto the liquid photopolymer; and applying radiation to the liquid photopolymer to cure the photoresist layer in exposed areas through the phototool or flexible plastics material,
wherein the liquid photopolymer is applied to both sides of the substrate simultaneously.

10. A method for photoimaging a substrate according to claim 1, wherein the liquid photopolymer is deposited in a substantially even and/or continuous manner.

11. A method for photoimaging a substrate according to claim 1, wherein the liquid photoresist layer is deposited using a spray, a brush, a roller and/or a dip coating system.

12. A method for photoimaging a substrate according to claim 1, wherein once the liquid photopolymer is applied to the substrate with the cladding and the phototool or flexible plastics material is positioned onto the substrate, a compressive force is applied to the deposited liquid photopolymer.

13. A method for photoimaging a substrate according to claim 12, wherein by applying the compressive force the liquid photopolymer is spread out and/or squeezed so that a substantially even continuous film of photoresist is achieved with a substantially even thickness.

14. A method for photoimaging a substrate according to claim 12, wherein the compressive force is a roller based system which applies a compressive rolling force.

15. A method for photoimaging a substrate according to claim 1, wherein the phototool or flexible plastics material is a negative or positive image of desired electrical circuitry.

16. A method for photoimaging a substrate according to claim 1, wherein the phototool_or flexible plastics material is connected to a mechanism which correctly positions the phototool or flexible plastics material on at least one or both sides of the substrate with the cladding.

17. A method for photoimaging a substrate according to claim 1, wherein the phototool or flexible plastics material does not comprise a protective layer.

18. A method for photoimaging a substrate according to claim 1, wherein the phototool or flexible plastics material comprises a protective layer which facilitates the phototool or flexible plastics material being peeled off the substrate with the cladding after imaging has taken place.

19. A method for photoimaging a substrate according to claim 1, wherein the radiation used is UV radiation.

20. A method for photoimaging a substrate according to claim 1, wherein UV LEDs or lasers are used as a source of the radiation.

21. A method for photoimaging a substrate according to claim 1, wherein the radiation is collimated to improve the quality of the photoimaging process.

22. A method for photoimaging a substrate according to claim 1, wherein a series of wet processes including a wash-off process are performed to produce electrical circuitry.

23. A method for photoimaging a substrate according to claim 1, wherein the method is performed in a self-contained mini-clean room.

24. A method for photoimaging a substrate according to claim 1, wherein the photoimaging process produces fine lines of less than about 200 μm, 150 μm, 140 μm, 130 μm, 120 μm, 110 μm, 100 μm, 90 μm, 80 μm, 70 μm, 60 μm, 50 μm, 40 μm, 30 μm, 20 μm, 10 μm or 5 μm.

25. A method for photoimaging a substrate according to claim 1, wherein the method comprises the following processes:
the depositing of a liquid photopolymer on at least one side of the substrate; the positioning of a phototool or flexible plastics material over the liquid photopolymer on at least one side of the substrate;
the application of a compressive force to the deposited liquid photopolymer to form a film of photopolymer; and
the application of radiation to the liquid photopolymer to cure the photoresist layer; wherein each the processes occur in either a single pass or in a series of separate passes.

26. A method for producing tracks and/or electrical circuitry on a substrate, said method comprising: providing a substrate; providing ink jet deposits on at least one side of the substrate, said ink jet deposits comprising conductive particles; depositing a liquid photopolymer on at least one side of the substrate comprising the ink jet deposits; positioning a phototool or flexible plastics material onto the liquid photopolymer on at least one side of the substrate; applying a compressive force to the deposited liquid photopolymer to form a film of photopolymer with a thickness less than about 178 μm (0.007 inch); and applying radiation to the liquid photopolymer to cure the photoresist layer in exposed areas through the phototool or flexible plastics material, wherein there is no drying or pre-curing step before the liquid photopolymer is exposed to the radiation to cure the photoresist layer in the exposed areas through the phototool or flexible plastics material.

27. A method for producing tracks and/or electrical circuitry on a substrate according to claim 26, wherein the ink jet deposits form an approximate required track and/or electrical circuitry on the substrate.

28. A method for producing tracks and/or electrical circuitry on a substrate according to claim 26, wherein the conductive particles comprise any one of or combination of the following: silver; gold; and/or copper.

29. A method for producing tracks and/or electrical circuitry on a substrate according to claim 26, wherein the ink jet deposits have a width of about 50 μm-500 μm.

30. A method for photoimaging a substrate according to claim 26, wherein after the photoimaging has occurred an etching process is performed to produce electrical circuitry.

31. A method for producing tracks and/or electrical circuitry on a substrate according to claim 26, wherein at least one track is formed within the ink jet deposits.

32. A method for photoimaging a substrate, said method comprising: providing a substrate with a cladding; depositing a liquid photopolymer on at least part of the cladding to form a film of photopolymer with a thickness of less than about 178 μm (0.007 inch); positioning a phototool or flexible plastics material onto the liquid photopolymer; and applying radiation to the liquid photopolymer to cure the photoresist layer in exposed areas through the phototool or flexible plastics material, wherein the substrate is made from a plastics sheet.

* * * * *